(12) United States Patent
Chia et al.

(10) Patent No.: US 12,165,707 B2
(45) Date of Patent: *Dec. 10, 2024

(54) MEMORY WITH FRAM AND SRAM OF IC

(71) Applicant: Taiwan Semiconductor Manufacturing Company, Ltd., Hsinchu (TW)

(72) Inventors: Han-Jong Chia, Hsinchu (TW); Sai-Hooi Yeong, Hsinchu County (TW); Yu-Ming Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/492,964

(22) Filed: Oct. 24, 2023

(65) Prior Publication Data
US 2024/0055049 A1 Feb. 15, 2024

Related U.S. Application Data

(63) Continuation of application No. 17/392,830, filed on Aug. 3, 2021, now Pat. No. 11,830,550, which is a
(Continued)

(51) Int. Cl.
*G11C 14/00* (2006.01)
*G11C 11/22* (2006.01)
(Continued)

(52) U.S. Cl.
CPC ........ *G11C 14/0072* (2013.01); *G11C 11/221* (2013.01); *G11C 11/223* (2013.01);
(Continued)

(58) Field of Classification Search
CPC . G11C 14/0072; G11C 11/221; G11C 11/223; G11C 11/2259; G11C 11/2275;
(Continued)

(56) References Cited

U.S. PATENT DOCUMENTS 10,825,834 B1 11/2020 Chen
10,879,269 B1 * 12/2020 Zhang ................... H10B 51/20
(Continued)

FOREIGN PATENT DOCUMENTS

WO 2018/125118 A1 7/2018
WO 2020/025426 A1 2/2020

*Primary Examiner* — Fernando Hidalgo
(74) *Attorney, Agent, or Firm* — McClure, Qualey & Rodack, LLP

(57) ABSTRACT

Memories are provided. A memory includes a plurality of ferroelectric random access memory (FRAM) cells arranged in a first memory array, a plurality of static random access memory (SRAM) cells arranged in a second memory array, and a controller configured to access the first memory array and the second memory array with different access rate. Each of the FRAM cells includes a ferroelectric field-effect transistor (FeFET). A gate structure of the FeFET includes a gate electrode over a channel of the FeFET, a ferroelectric layer over the gate electrode, a first electrode over the gate electrode, and a second electrode over the first electrode. The ferroelectric layer is formed between the first and second electrodes.

20 Claims, 8 Drawing Sheets

Related U.S. Application Data continuation of application No. 16/785,997, filed on Feb. 10, 2020, now Pat. No. 11,087,843.

(51) Int. Cl.
   | | |
   |---|---|
   | *G11C 11/419* | (2006.01) |
   | *H10B 10/00* | (2023.01) |
   | *H10B 51/30* | (2023.01) |
   | *H10B 53/30* | (2023.01) |

(52) U.S. Cl.
   CPC ...... *G11C 11/2259* (2013.01); *G11C 11/2275* (2013.01); *G11C 11/419* (2013.01); *H10B 10/12* (2023.02); *H10B 51/30* (2023.02); *H10B 53/30* (2023.02)

(58) Field of Classification Search
   CPC ............... G11C 11/419; G11C 7/1015; G11C 2207/2272; H10B 10/12; H10B 51/30; H10B 53/30; H01L 29/40111; H01L 29/516
   USPC .......................................................... 365/145
   See application file for complete search history.

(56) References Cited

U.S. PATENT DOCUMENTS

| | | | |
|---|---|---|---|
| 11,087,843 | B1* | 8/2021 | Chia ..................... G11C 11/419 |
| 11,830,550 | B2* | 11/2023 | Chia ...................... H10B 10/12 |
| 2005/0059172 | A1* | 3/2005 | Kim .................. H01L 29/78391 |
| | | | 257/E21.208 |
| 2013/0247057 | A1 | 9/2013 | Fujimori |
| 2016/0358640 | A1 | 12/2016 | Brederlow |
| 2016/0365145 | A1 | 12/2016 | Ashokkumar |
| 2017/0343987 | A1 | 11/2017 | Jayakumar |
| 2017/0345831 | A1* | 11/2017 | Chavan ................... H01L 28/60 |
| 2020/0105771 | A1 | 4/2020 | Morris |
| 2020/0203380 | A1 | 6/2020 | Prasad |
| 2020/0211839 | A1 | 7/2020 | Salahuddin |
| 2020/0227421 | A1 | 7/2020 | Jeong |
| 2020/0357821 | A1 | 11/2020 | Chen |
| 2020/0411072 | A1* | 12/2020 | Zhang .................... H10B 51/10 |
| 2021/0028187 | A1 | 1/2021 | Byeon |
| 2021/0098466 | A1 | 4/2021 | Liaw |
| 2021/0242225 | A1* | 8/2021 | Manfrini ................ H10B 53/00 |
| 2021/0244425 | A1 | 8/2021 | Patel |
| 2023/0062718 | A1* | 3/2023 | Chen .................. G11C 16/0466 |

* cited by examiner

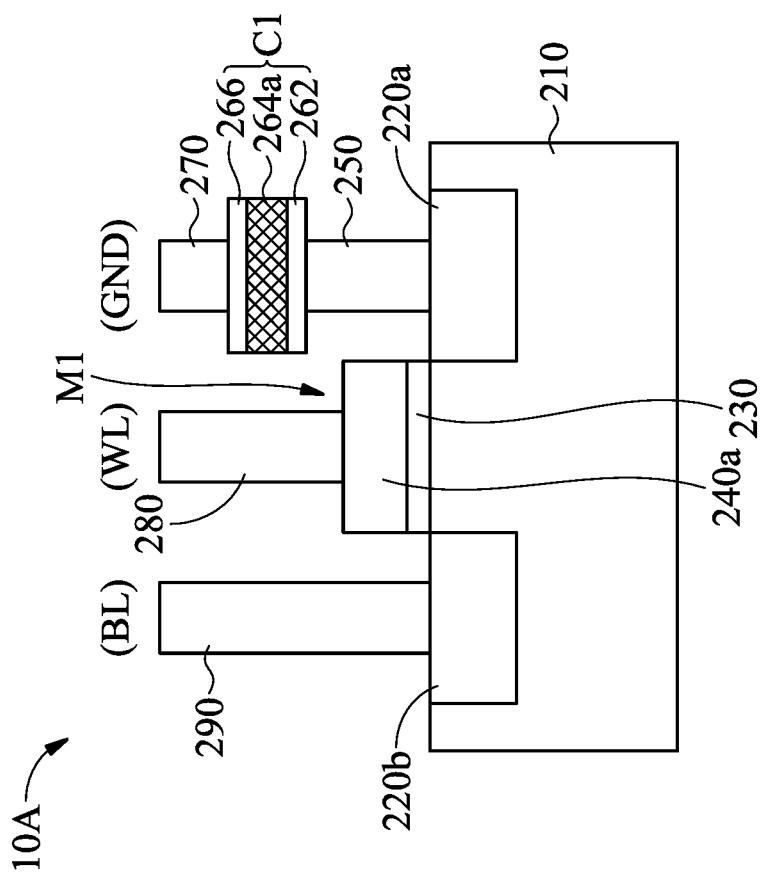
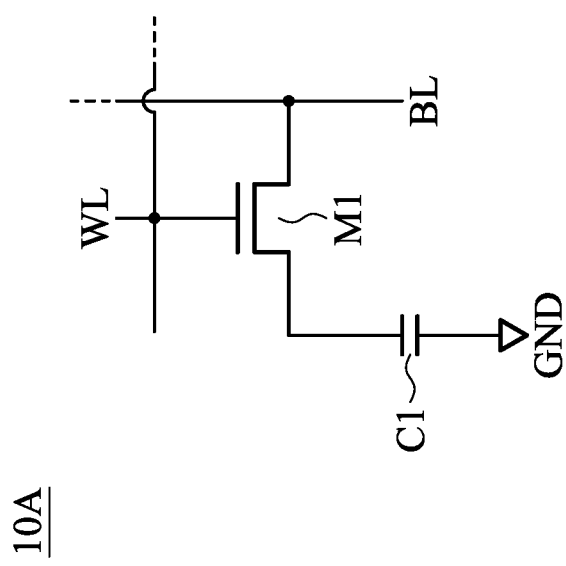
FIG. 1A
FIG. 1B

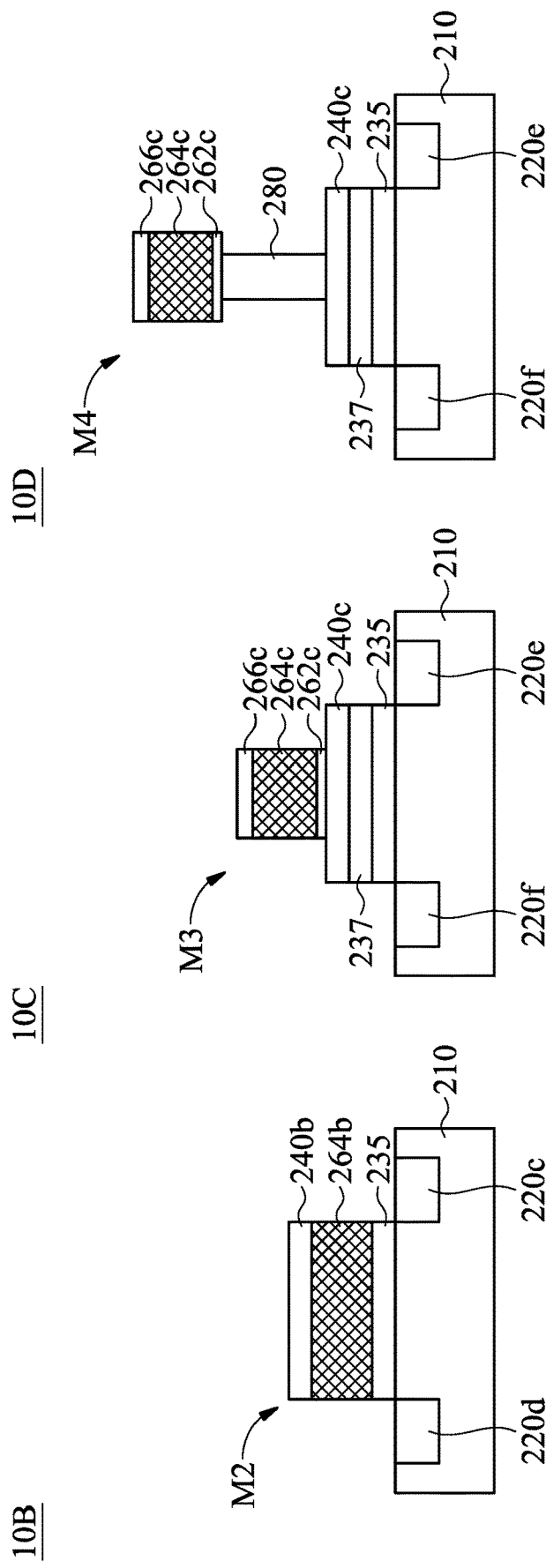

MEMORY WITH FRAM AND SRAM OF IC

CROSS REFERENCE TO RELATED APPLICATIONS

This Application is a Continuation of U.S. application Ser. No. 17/392,830, filed on Aug. 3, 2021, now U.S. Pat. No. 11,830,550, which is a Continuation of U.S. application Ser. No. 16/785,997, filed on Feb. 10, 2020, now U.S. Pat. No. 11,087,843, the entirety of which is incorporated by reference herein.

BACKGROUND

Traditionally, there are two basic categories of computer memory: volatile and non-volatile. Volatile memory includes static random access memory (SRAM) and dynamic random access memory (DRAM). Both SRAM and DRAM will lose saved data when the power is turned off. Non-volatile memory does not lose its stored data when the unit is powered off. In general, non-volatile memory is a read-only memory (ROM), and it is difficult to write data, such as EPROM, EEPROM and Flash. The memories not only have a slow writing speed, but they can also only be erased and written a limited number of times.

Ferroelectric memory (FRAM) is a type of random access memory, and is capable of keeping data after the power is turned off (examples include read-only memory and flash memory). Compared with traditional non-volatile memory, it has attracted much attention due to its advantages such as low power consumption, fast read and write speeds, and strong anti-irradiation capabilities.

BRIEF DESCRIPTION OF THE DRAWINGS

Aspects of the present disclosure are best understood from the following detailed description when read with the accompanying figures. It should be noted that, in accordance with the standard practice in the industry, various nodes are not drawn to scale. In fact, the dimensions of the various nodes may be arbitrarily increased or reduced for clarity of discussion.

FIG. 1A illustrates a circuit of a FRAM cell, in accordance with some embodiments of the disclosure.

FIG. 1B illustrates a semiconductor structure of the FRAM cell of FIG. 1A, in accordance with some embodiments of the disclosure.

FIG. 2A illustrates a semiconductor structure of a FRAM cell, in accordance with some embodiments of the disclosure.

FIG. 2B illustrates a semiconductor structure of a FRAM cell, in accordance with some embodiments of the disclosure.

FIG. 2C illustrates a semiconductor structure of a FRAM cell, in accordance with some embodiments of the disclosure.

DETAILED DESCRIPTION

Figure 3A:
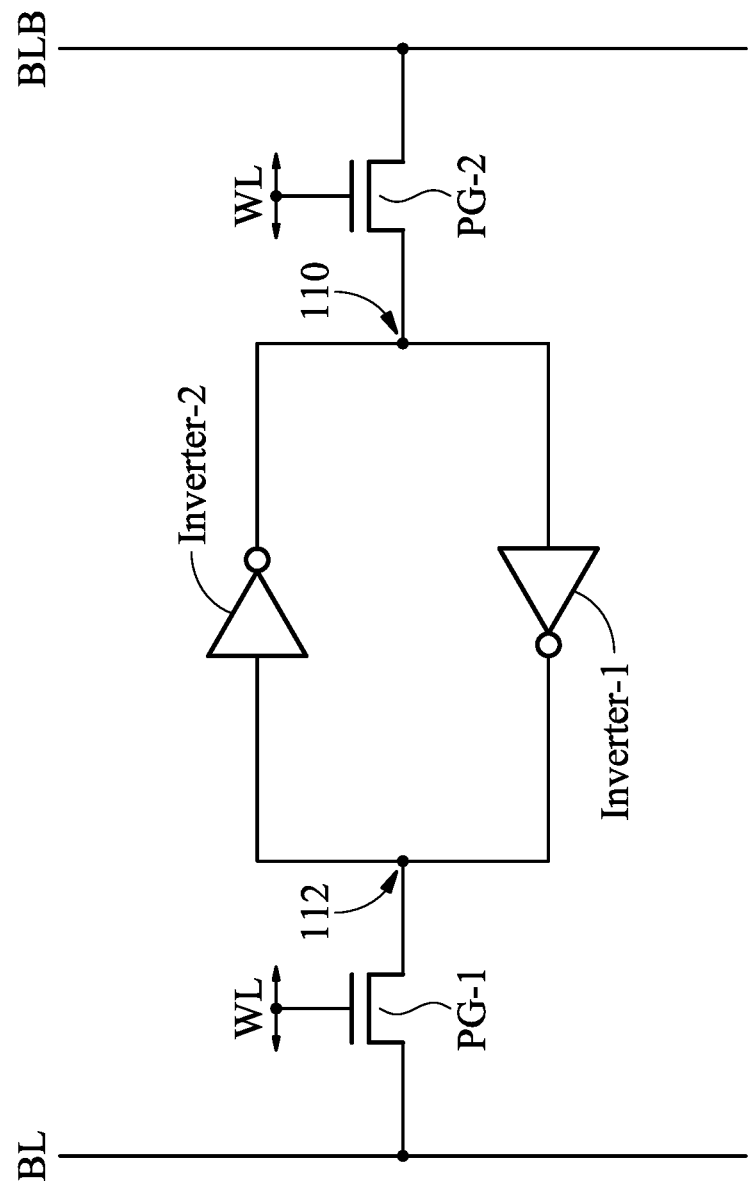
FIG. 3A shows a single-port SRAM cell, in accordance with some embodiments of the disclosure.

The following disclosure provides many different embodiments, or examples, for implementing different nodes of the subject matter provided. Specific examples of components and arrangements are described below to simplify the present disclosure. These are, of course, merely examples and are not intended to be limiting. In some embodiments, the formation of a first node over or on a second node in the description that follows may include embodiments in which the first and the second nodes are formed in direct contact, and may also include embodiments in which additional nodes may be formed between the first and the second nodes, such that the first and the second nodes may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and/or after a disclosed method, and some of the operations described can be replaced or eliminated for other embodiments of the method.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In an electronic device, a processor typically is implemented on an integrated circuit (IC) and may include one or more processing units (or cores) and one or more cache memories. The level-1 (L1), level-2 (L2) and level-3 (L3) caches typically may be implemented using static random access memory (SRAM). The L1 cache is the fastest cache memory, and the L1 cache is used to store data that was accessed by the processor recently. Furthermore, the L1 cache is the first cache to be accessed and processed when the processor performs a computer instruction. The L2 cache may not be as fast as the L1 cache, but the capacity can be increased. The L3 cache works together with the L1 and L2 caches to improve computer performance by preventing bottlenecks due to the fetch-execute cycle taking too long. Furthermore, memory performance of the L3 cache is slower compared to the L2 cache. For example, the L1 cache may typically have a faster response time than the L2 cache, and the L2 cache may typically have a faster response time than the L3 cache.

In the electronic device, the processor is coupled to a main memory through one or more buses. The main memory typically may be implemented using dynamic random access memory (DRAM) on one or more DRAM chips. DRAM may typically have a slower response time than the L3 cache.

Based on improving semiconductor technologies, FRAM has some unique characteristics. FRAM is compatible with all the functions of RAM, and it is a non-volatile memory like a ROM. Furthermore, the FRAM can store data in low-power conditions, and thus FRAM is widely used in portable devices, such as personal digital assistants (PDA) and mobile phones.

FIG. 1A illustrates a circuit of a FRAM cell 10A, in accordance with some embodiments of the disclosure. The FRAM cell 10A includes a transistor M1 and a capacitor C1. The transistor M1 is coupled between the capacitor C1 and a bit line BL corresponding to the FRAM cell 10A, and a gate of the transistor M1 is coupled to a word line WL corresponding to the FRAM cell 10A. In some embodiments, the transistor M1 may be a planar MOS transistor or a fin field effect transistor (FinFET) with single fin or multiple-fin. Furthermore, The capacitor C1 is coupled between the transistor M1 and a ground GND. In some embodiments, the capacitor C1 is coupled between the transistor M1 and a reference signal with a reference voltage. The capacitor C1 is formed by sandwiching a thin ferroelectric film between two conductive electrodes. The read/write operations of the FRAM cell 10A is similar to that of dynamic random access memories (DRAM), except that no data refreshing is necessary in the FRAM cell 10A.

FIG. 1B illustrates a semiconductor structure of the FRAM cell 10A of FIG. 1A, in accordance with some embodiments of the disclosure. In FIG. 1B, the transistor M1 is a planar MOS transistor. A gate structure of the transistor M1 includes a dielectric layer 230 over a substrate 210, and a gate electrode 240a over the dielectric layer 230. The gate structure of the transistor M1 is formed over the substrate 210 and between the doped regions 220a and 220b. Furthermore, the gate electrode 240a is coupled to the corresponding word line WL through a metal layer 280. A channel of the transistor M1 is formed between the doped regions 220a and 220b and under the dielectric layer 230 when the transistor M1 is turned on by the corresponding word line WL. In some embodiments, the gate electrode 240a may include a metallic material such as silver, aluminum, tungsten, nickel, or an alloy thereof.

In FIG. 1B, the doped regions 220a and 220b form the source and drain of the transistor M1. The doped region 220b is coupled to the corresponding bit line BL through a metal layer 290. The doped region 220a is coupled to the capacitor C1 through a metal layer 250. The capacitor C1 includes a bottom electrode 262, a top electrode 266 and a ferroelectric layer 264a between the bottom electrode 262 and the top electrode 266. In some embodiments, the ferroelectric layer 264a is formed by a hafnium oxide, e.g., $HfO_2$. Furthermore, the capacitor C1 is coupled to the ground GND through the metal layer 270. In some embodiments, the bottom electrode 262 and the top electrode 266 may include a metallic material such as silver, aluminum, tungsten, nickel, or an alloy thereof.

In some embodiments, the transistor M1 is a FinFET with single fin or multiple-fin. In some embodiments, the transistor M1 is an N-type transistor, and the doped regions 220a and 220b are the N-type doped regions. In some embodiments, the substrate 210 is a Si substrate. In some embodiments, the material of the substrate 210 is selected from a group consisting of bulk-Si, SiP, SiGe, SiC, SiPC, Ge, SOI—Si, SOI—SiGe, III-VI material, or a combination thereof.

The ferroelectric layer 264a includes a ferroelectric material containing a crystal that can spontaneously polarize. The ferroelectric material has two states that can be reversed by an external electric field. When an electric field is applied to the ferroelectric crystal, the central atom moves in the crystal following the direction of the electric field. When an atom moves, it passes through an energy barrier, changing the polarization direction. Internal circuits react to the change in polarization and set the memory. After the electric field is removed, the central atom remains polarized, which makes the materials non-volatile, and thus the state of the memory is preserved.

Nowadays, there are two main types of ferroelectric materials: lead zirconate titanate (PZT) and strontium bismuth tantalate (SBT). Furthermore, with an external electric field, the polarization characteristics of ferroelectric materials of the ferroelectric layer 264a will change. When the electric field is removed, the data can still be saved. Without an external electric field, there are two stable states of polarization characteristics for representing two logic states of "0" and "1". Furthermore, because the information storage of FRAM is realized by polarization and not free electrons, the leakage current of the capacitor C1 does not need to be considered.

In some embodiments, the exemplary materials of ferroelectric layer 264a include $HfO_2$, $HfSiO_x$, $HfZrO_x$, $Al_2O_3$, $TiO_2$, $LaO_x$, $BaSrTiO_x$ (BST), $PbZrTiO_x$ (PZT), or the like. Furthermore, the ferroelectric layer 264a may be formed by using Physical Vapor Deposition (PVD).

FIG. 2A illustrates a semiconductor structure of a FRAM cell 10B, in accordance with some embodiments of the disclosure. The FRAM cell 10B includes a transistor M2. The transistor M2 is a ferroelectric-gate-controlled field effect transistor (FeFET), and is formed in front-end-of-line (FEOL) semiconductor fabrication processes by depositing the ferroelectric layer 264b directly onto the gate structure of the transistor M2. Compared with the FRAM cell 10A of FIGS. 1A and 1B, no capacitor C1 is present in the FRAM cell 10B. In some embodiments, the transistor M2 may be a planar transistor or a fin transistor with single fin or multiple-fins.

In the FRAM cell 10B of FIG. 2A, the doped regions 220c and 220d form the source and drain of the transistor M2. One of the doped regions 220c and 220d is coupled to the corresponding bit line BL through the upper metal layer (not shown), and another doped region is coupled to the source line through the upper metal layer (not shown). A gate structure of the transistor M2 includes an interfacial layer (IL) 235, the ferroelectric layer 264b, and the gate electrode 240b. The interfacial layer 235 is formed over the substrate 210. The ferroelectric layer 264b is formed over the interfacial layer 235. The gate electrode 240b is formed over the ferroelectric layer 264b. The gate electrode 240b is coupled to the corresponding word line WL through the upper metal layer (not shown). A channel of the transistor M2 is formed between the doped regions 220c and 220d and under the interfacial layer 235 when the transistor M2 is turned on by the corresponding word line WL.

In some embodiments, the exemplary materials of ferroelectric layer 264b include $HfO_2$, $HfSiO_x$, $HfZrO_x$, $Al_2O_3$, $TiO_2$, $LaO_x$, $BaSrTiO_x$ (BST), $PbZrTiO_x$ (PZT), or the like.

In some embodiments, the transistor M2 is an N-type transistor, and the doped regions 220c and 220d are the N-type doped regions. In some embodiments, the transistor M2 is a P-type transistor, and the doped regions 220c and 220d are the P-type doped regions formed in a well region (not shown) over the substrate 210. In some embodiments, the substrate 210 is a Si substrate. In some embodiments, the material of the substrate 210 is selected from a group consisting of bulk-Si, SiP, SiGe, SiC, SiPC, Ge, SOI—Si, SOI—SiGe, III-VI material, or a combination thereof.

FIG. 2B illustrates a semiconductor structure of a FRAM cell 10C, in accordance with some embodiments of the disclosure. The FRAM cell 10C includes a transistor M3. The transistor M3 is a FeFET, and is formed in middle-end-of-line (MEOL) semiconductor fabrication processes by depositing the ferroelectric layer 264c over the gate structure of the transistor M3. Compared with the FRAM cell 10A of FIGS. 1A and 1B, no capacitor C1 is present in the FRAM cell 10C. In some embodiments, the FRAM cell 10C is the structure including a metal-insulator-metal device which resembles a capacitor. However, for the data of the FRAM cell 10C, only the threshold voltage Vt of the transistor M3 is measured rather than the charge stored in the capacitor. In some embodiments, the transistor M3 may be a planar transistor or a fin transistor with single fin or multiple-fins including a metal-ferroelectric-metal structure.

In the FRAM cell 10C, the doped regions 220e and 220f form the source and drain of the transistor M3. One of the doped regions 220e and 220f is coupled to the corresponding bit line BL through the upper metal layer (not shown), and another doped region is coupled to the source line through the upper metal layer (not shown). The gate structure of the transistor M3 at least includes an interfacial layer 235, a dielectric layer 237 of high-K material, a gate electrode 240c, and the ferroelectric layer 264c. The interfacial layer 235 is formed over the substrate 210. The dielectric layer 237 of high-K material is formed over the interfacial layer 235. The dielectric layer 237 of high-K material has a dielectric constant (k-value) higher than 3.9. The exemplary materials of the dielectric layer 237 include $HfO_2$, $Al_2O_3$, $HfSiO_x$, $La_2O_3$, or the like. The dielectric layer 237 may be formed using Atomic Layer Deposition (ALD), Plasma Enhance Chemical Vapor Deposition (PECVD), or the like.

In the FRAM cell 10C of FIG. 2B, the gate electrode 240c is formed over the dielectric layer 237. The ferroelectric layer 264c is formed over the gate electrode 240c. In such embodiments, the gate electrode 240c is an internal gate metal. In some embodiments, the ferroelectric layer 264c is further formed between the bottom electrode 262c and the top electrode 266c.

In some embodiments, the exemplary materials of ferroelectric layer 264c include $HfO_2$, $HfSiO_x$, $HfZrO_x$, $Al_2O_3$, $TiO_2$, $LaO_x$, $BaSrTiO_x$ (BST), $PbZrTiO_x$ (PZT), or the like. It is appreciated that although some of the candidate materials (such as $HfO_2$, $HfSiO_x$, $HfZrO_x$, $Al_2O_3$, $TiO_2$, and $LaO_x$) of ferroelectric layer 264c include the same elements as some high-k dielectric materials, ferroelectric layer 264c has different properties than high-k dielectric materials. For example, ferroelectric layer 264c may have a resistivity lower than the respective high-k dielectric material that contains the same type of elements.

The gate electrode 240c is coupled to the corresponding word line WL through the ferroelectric layer 264c. A channel of the transistor M3 is formed between the doped regions 220e and 220f and under the interfacial layer 235 when the transistor M3 is turned on. In some embodiments, the transistor M3 is an N-type transistor, and the doped regions 220e and 220f are the N-type doped regions. In some embodiments, the transistor M3 is a P-type transistor, and the doped regions 220e and 220f are the P-type doped regions formed in a well region (not shown) over the substrate 210.

FIG. 2C illustrates a semiconductor structure of a FRAM cell 10D, in accordance with some embodiments of the disclosure. The FRAM cell 10D includes a transistor M4. The transistor M4 is a FeFET, and is formed in back-end-of-line (BEOL) semiconductor fabrication processes by depositing the ferroelectric layer 264d over the gate structure of the transistor M4. The transistor M4 of FIG. 2C is similar with the FeFET M3 of FIG. 2B, and the different between the transistors M3 and M4 is that a metal layer 280 is formed between the gate electrode 240c and the ferroelectric layer 264c in FIG. 2C. Thus, the gate electrode 240c is coupled to the corresponding word line WL through the metal layer 280 and the ferroelectric layer 264c. A channel of the transistor M4 is formed between the doped regions 220e and 220f and under the interfacial layer 235 when the transistor M4 is turned on.

Compared with the transistor M1 of FIG. 1B, the transistors M2 of FIG. 2A, M3 of FIG. 2B and M4 of FIG. 2C are the ferroelectric-gate controlled FETs. FRAM cell with the FeFET structure have two major advantages: (1) less area, and (2) non-destructive readout (NDR). For example, the FRAM cell of FIG. 1B has destructive readout. The NDR represents a FeFET to be read thousands of times without switching the ferroelectric polarization.

FIG. 3A shows a single-port SRAM cell 20, in accordance with some embodiments of the disclosure. The SRAM cell 20 is a six-transistor (6T) SRAM cell and includes a pair of cross-coupled inverters Inverter-1 and Inverter-2, and two pass-gate transistors PG-1 and PG-2. The inverters Inverter-1 and Inverter-2 are cross-coupled between the nodes 112 and 110, and form a latch. The pass-gate transistor PG-1 is coupled between a bit line BL corresponding to the SRAM cell 20 and the node 112, and the pass-gate transistor PG-2 is coupled between a complementary bit line BLB corresponding to the SRAM cell 20 and the node 110, wherein the complementary bit line BLB is complementary to the bit line BL. The gates of the pass-gate transistors PG-1 and PG-2 are coupled to the same word-line WL. Furthermore, the pass-gate transistors PG-1 and PG-2 are NMOS transistors.

Figure 3B:
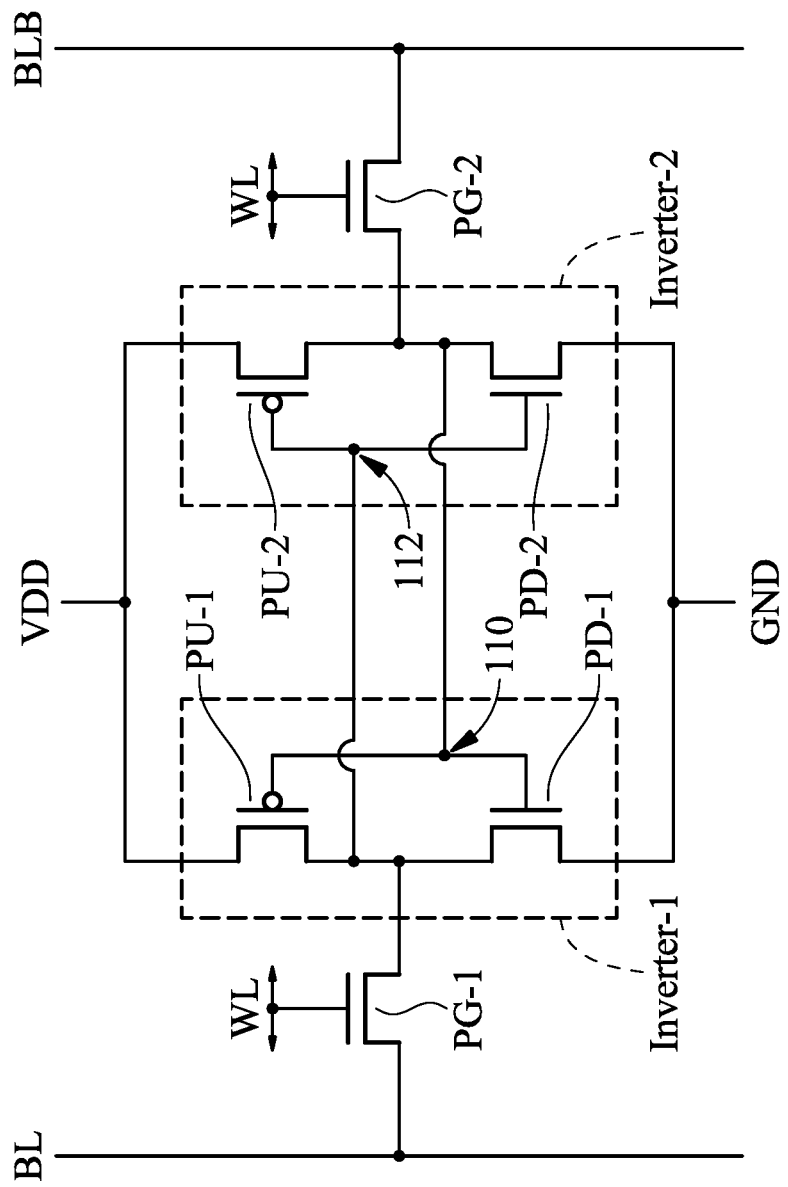
FIG. 3B shows a simplified diagram of the SRAM cell of FIG. 3A, in accordance with some embodiments of the disclosure.

FIG. 3B shows a simplified diagram of the SRAM cell 20 of FIG. 3A, in accordance with some embodiments of the disclosure. The inverter Inverter-1 includes a pull-up transistor PU-1 and a pull-down transistor PD-1. The pull-up transistor PU-1 is a PMOS transistor, and the pull-down transistor PD-1 is an NMOS transistor. The drain of the pull-up transistor PU-1 and the drain of the pull-down transistor PD-1 are coupled to the node 112 connecting the pass-gate transistor PG-1. The gates of the pull-up transistor PU-1 and the pull-down transistor PD-1 are coupled to the node 110 connecting the pass-gate transistor PG-2. Furthermore, the source of the pull-up transistor PU-1 is coupled to the positive power supply node VDD, and the source of the pull-down transistor PD-1 is coupled to a ground GND.

Similarly, the inverter Inverter-2 includes a pull-up transistor PU-2 and a pull-down transistor PD-2. The pull-up transistor PU-2 is a PMOS transistor, and the pull-down transistor PD-2 is an NMOS transistor. The drains of the pull-up transistor PU-2 and the pull-down transistor PD-2 are coupled to the node 110 connecting the pass-gate transistor PG-2. The gates of the pull-up transistor PU-2 and the pull-down transistor PD-2 are coupled to the node 112 connecting the pass gate transistor PG-1. Furthermore, the source of the pull-up transistor PU-2 is coupled to the positive power supply node VDD, and the source of the pull-down transistor PD-2 is coupled to the ground VSS.

In some embodiments, the pass-gate transistors PG-1 and PG-2, the pull-up transistors PU-1 and PU-2, and the pull-down transistors PD-1 and PD-2 of the SRAM cell 10 are FinFETs.

In some embodiments, the pass-gate transistors PG-1 and PG-2, the pull-up transistors PU-1 and PU-2, and the pull-down transistors PD-1 and PD-2 of the SRAM cell 10 are planar MOS devices.

The size of the FRAM cell (e.g., 10A of FIGS. 1A and 1B, 10B of FIG. 2A, 10C of FIGS. 2B and 10D of FIG. 2C) is significantly smaller than the SRAM cell (e.g., 20 of FIGS. 3A and 3B) since the FRAM cell can be used as a 1T-1C (1 transistor-1 capacitor) structure (e.g., the FRAM cell 10A) or a FeFET structure (e.g., the FRAM cell 10B, 10C or 10D). The capacitor (e.g., the capacitor C1 of FIGS. 1A and 1B) structure can either be at FEOL by fine-tuning the material composition and thickness of the gate dielectric, such as 10B of FIG. 2A, or at MEOL or BEOL by utilizing a metal-ferroelectric-metal structure, such as 10C of FIGS. 2B and 10D of FIG. 2C.

In some embodiments, more than one fin may be used in a FeFET structure if the voltage of the ferroelectric layer (e.g., 264c of FIGS. 2B and 2C) is fine-tuned. The overall cell size of the FRAM cell is still smaller than that of the SRAM cell even using multiple fins (e.g., 4 fins) to form the FRAM cell.

Figure 4:
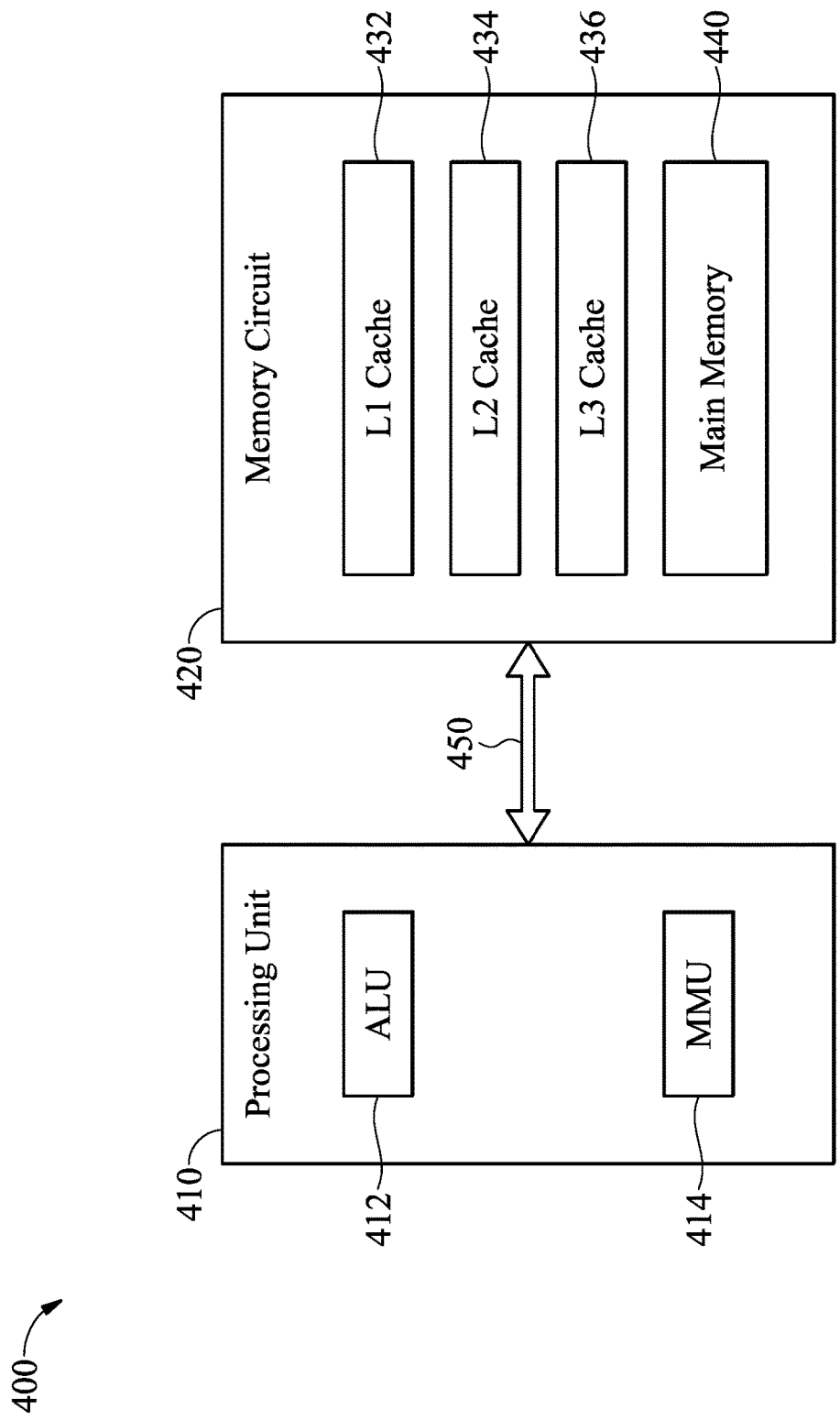
FIG. 4 shows a simplified block diagram of an IC, in accordance with some embodiments of the disclosure.

FIG. 4 shows a simplified block diagram of an IC 400, in accordance with some embodiments of the disclosure. The IC 400 includes a processing unit 410, which as illustrated includes an arithmetic logic unit (ALU) 412 and a memory management unit (MMU) 414, and a memory circuit 420 integrated into the IC 400. The processing unit 410 may include various components such as one or more flip-flops, one or more scan chains, one or more registers, etc., which are omitted from FIG. 4 for ease of illustration.

The memory circuit 420 includes a plurality of memory cells (e.g., SRAM and/or FRAM cells) organized into a L1 cache 432, a L2 cache 434, a L3 cache 436, and a main memory 440. In some embodiments, the memory circuit 420 further includes a secondary storage (not shown). Any suitable type of SRAM and FRAM cells may be employed, as well as various combinations thereof. For example, the level-1 cache 432, the level-2 cache 434, the level-3 cache 436, or the main memory 330 may be implemented by the SRAM cells and/or the FRAM cells. The processing unit 410, the memory circuit 420 and other circuits (not shown) are communicatively coupled together by an internal bus system 450 in the IC 400.

The one or more processing units 410, in operation, generate one or more signals to control operation of the IC 400. Such functionality may be provided by, for example, the processing unit 410 executing instructions retrieved from the memory circuit 420. The MMU 414 of the processing unit 410, in operation, may control storage and retrieval of data and instructions from the level-1 cache 432, the level-2 cache 434, the level-3 cache 436, and the main memory 440 of the memory circuit 420 via the internal bus system 450, and/or from one or more memories external to the IC 400 via one or more interfaces (not shown). The MMU 414 may include a plurality of addressing circuits, which may facilitate simultaneous use of the cache 432, 434 and 436 and the main memory 440.

Memory management routines (e.g., cache control routines) may be employed to control the transfer of data and instructions between the L1 cache 432, the L2 cache 434, the L3 cache 436, and the main memory 440.

Embodiments of the IC 400 of FIG. 4 may have fewer components than illustrated, may have more components than illustrated, may combine or separate illustrated components, and may re-arrange the illustrated components. For example, the MMU 414 may be split into multiple MMUs 414 (e.g., a first MMU 414 for controlling the L1 and L2 caches 432 and 434, a second MMU 414 for controlling the L3 cache 436, and a third MMU 414 for controlling the main memory 440). In another example, the MMU 414 may be part of the memory circuit 420 instead of the processing unit 410.

Figure 5:
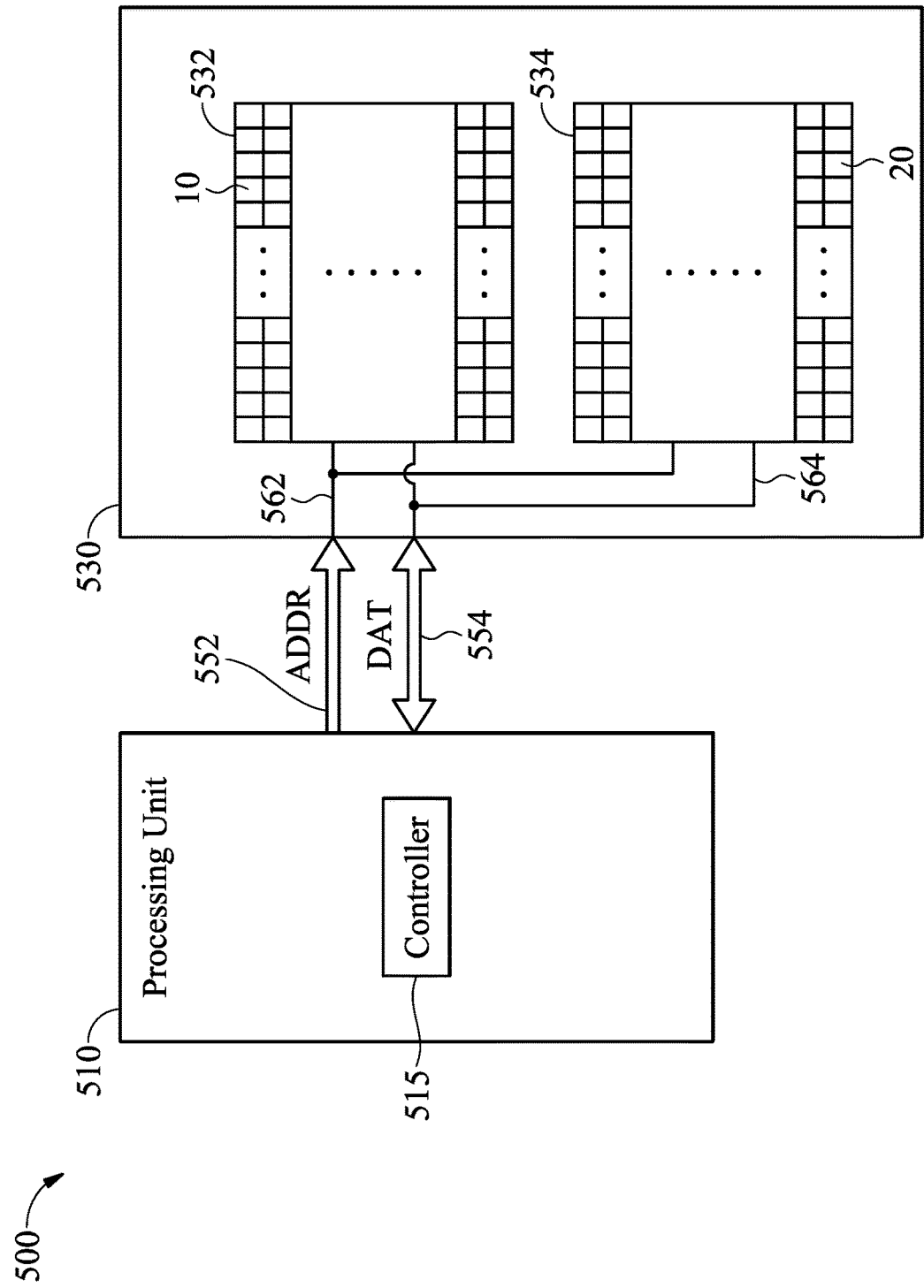
FIG. 5 shows a block diagram of an IC, in accordance with some embodiments of the disclosure.

FIG. 5 shows a block diagram of an IC 500, in accordance with some embodiments of the disclosure. The IC 500 includes a processing unit 510, which as illustrated includes a controller 515, and a memory (or memory circuit) 530 integrated into the IC 500. In some embodiments, the controller 515 may include an ALU (e.g., 412 of FIG. 4) and a MMU (e.g., 414 of FIG. 4). The processing unit 510 may include various components such as one or more flip-flops, one or more scan chains, one or more registers, etc., which are omitted from FIG. 5 for ease of illustration.

The memory 530 includes a plurality of FRAM cells 10 and a plurality of SRAM cells 20. The FRAM cells 10 (e.g., 10A-10D of FIGS. 1A-2C) are arranged in rows and columns of a first memory array 532, and the SRAM cells 20 (e.g., 20 of FIGS. 3A and 3B) are arranged in rows and columns of a second memory array 534. The first memory array 532 and the second memory array 534 are formed over the substrate of the IC 500. In some embodiments, the first memory array 532 is adjacent to the second memory array 534. For example, the first memory array 532 is in contact with the second memory array 534 in the layout. In some embodiments, the first memory array 532 is separated from the second memory array 534 in the layout. In some embodiments, the memory 530 may function as the cache (e.g., the cache 432, 434 or 436 of FIG. 4) or the main memory (e.g., the main memory 440 of FIG. 4) of an IC.

In the processing unit 510, the controller 515 is configured to access the memory 530 through an address bus 552 and a data bus 554 in response to instructions of the processing unit 510. In some embodiments, the controller 515 is configured to provide the address ADDR to the memory 530 through the address bus 552. Furthermore, the controller 515 is configured to provide the data DAT corresponding to the address ADDR to the memory 530 through the data bus 554 during a write operation. Conversely, the controller 515 is configured to obtain the data DAT corresponding to the address ADDR from the memory 530 through the data bus 554 during a read operation. In some embodiments, the data bus 554 and the address bus 552 are a global bus for accessing the memories within the IC 500, such as the internal bus system 450 in FIG. 4.

In the memory 530, an internal address bus 562 is shared by the first memory array 532 and the second memory array 534, and the internal address bus 562 is further coupled to the address bus 552. Similarly, an internal data bus 564 is shared by the first memory array 532 and the second memory array 534, and the internal data bus 564 is further coupled to the data bus 554.

In some embodiments, the number of FRAM cells 10 in the first memory array 532 and the number of SRAM cells 20 in the second memory array 534 are determined according to the capacity of the memory 530. Furthermore, the quantity ratio of the FRAM cells 10 and the SRAM cells 20 represents the ratio of the number of FRAM cells 10 to the number of SRAM cells 20. In some embodiments, the quantity ratio of the FRAM cells 10 and the SRAM cells 20 is determined according to the access latency of the memory 530. In some embodiments, the quantity ratio of the FRAM cells 10 and the SRAM cells 20 is determined according to the areas of the SRAM cell 20 and the FRAM cell 10. In some embodiments, the quantity ratio of the FRAM cells 10 and the SRAM cells 20 is determined according to the area of the memory 530.

Figure 6:
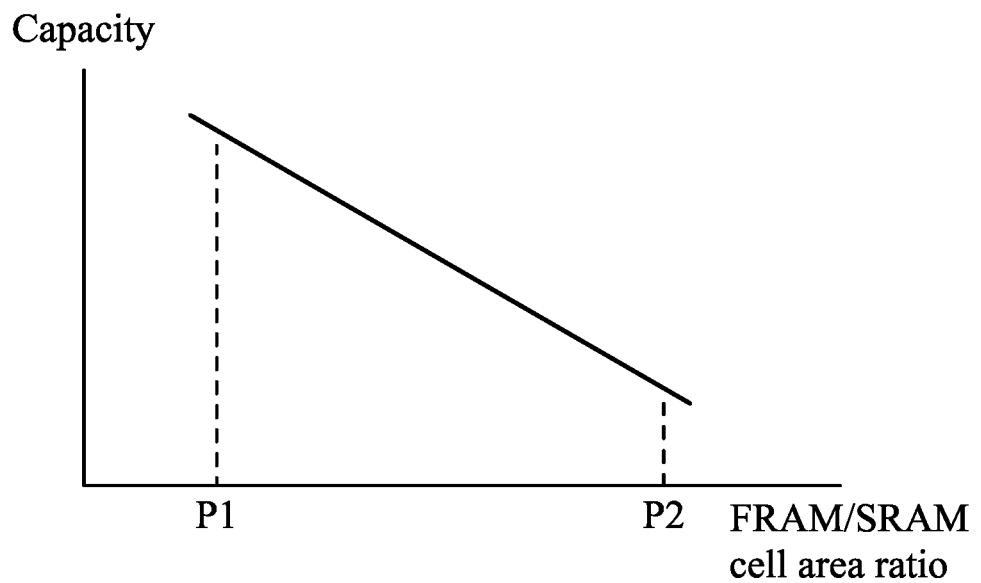
FIG. 6 illustrates the relationship between the capacity of the memory and the cell area ratio of the FRAM cell and the SRAM cell of FIG. 5, in accordance with some embodiments of the disclosure.

FIG. 6 illustrates the relationship between the capacity of the memory 530 and the cell area ratio of the FRAM cell 10 and the SRAM cell 20 of FIG. 5, in accordance with some embodiments of the disclosure. In some embodiments, the graph of FIG. 6 is obtained in the same area of the memory 530. If the cell area of the FRAM cell 10 is less than that of the SRAM cell 20, the cell area ratio of the FRAM cell 10 and the SRAM cell 20 is less than 1. Conversely, if the cell area of the FRAM cell 10 is equal to or greater that of the SRAM cell 20, the cell area ratio of the FRAM cell 10 and the SRAM cell 20 is equal to or greater than 1.

In some embodiments, assuming that the area of the memory 530 is fixed, when the cell area ratio of the FRAM cell 10 and the SRAM cell 20 is decreased (i.e., the FRAM cell 10 has a smaller area), more FRAM cells 10 are inserted into the area of the memory 530. Thus, the capacity of the memory 530 is increased, as shown at point P1. When the cell area ratio of the FRAM cell 10 and the SRAM cell 20 is increased (i.e., the FRAM cell 10 has a greater area), less FRAM cells 10 are inserted into the area of the memory 530. Thus, the capacity of the memory 530 is decreased, as shown at point P2. Therefore, as the cell area between the FRAM cell 10 and the SRAM cell 20 gets closer in size, the overall capacity of the memory 530 will shrink.

Figure 7:
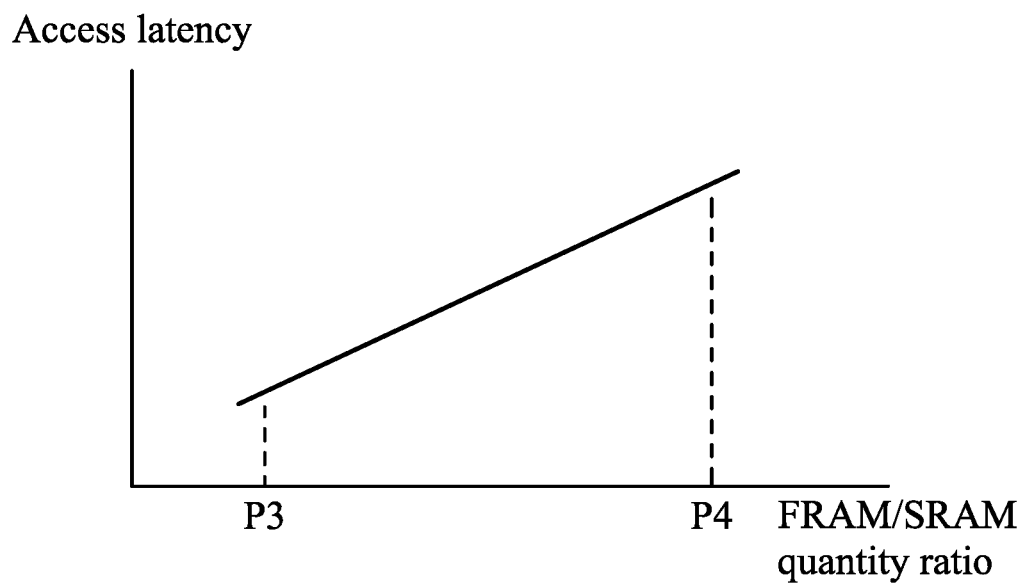
FIG. 7 illustrates the relationship between the access latency (e.g., write and/or read latency) and the quantity ratio of the FRAM cell and the SRAM cell of FIG. 5, in accordance with some embodiments of the disclosure.

FIG. 7 illustrates the relationship between the access latency (e.g., write and/or read latency) and the quantity ratio of the FRAM cell 10 and the SRAM cell 20 of FIG. 5, in accordance with some embodiments of the disclosure. In some embodiments, the graph of FIG. 7 is obtained in the same capacity of the memory 530. If there are fewer FRAM cells 10 than SRAM cells 20 in the memory 530, the quantity ratio of the FRAM cell 10 and the SRAM cell 20 is less than 1. Conversely, if the number of FRAM cells 10 is equal to or greater than that of the SRAM cells 20 in the memory 530, the quantity ratio of the FRAM cell 10 and the SRAM cell 20 is equal to or greater than 1.

In general, the access latency of a memory is the time (the latency) between initiating a request for a byte or word in the memory until it is retrieved by a processor. Therefore, the access latency is a fundamental measure of the speed of memory. In other words, when the access latency is decreased, the access operation is speed up for the memory. Compared with the SRAM cell 20, the FRAM cell 10 has poor latency (i.e., larger latency), but has a smaller cell area. In some embodiments, the cell area of the FRAM cell 10 is less than 0.25 times the cell area of the SRAM cell 20.

In some embodiments, assuming that the capacity of the memory 530 is fixed, when the quantity ratio of the FRAM cells 10 and the SRAM cells 20 is decreased (i.e., the number of FRAM cells 10 is decreased and the number of SRAM cells 20 is increased), the access latency of the memory 530 is decreased, as shown at point P3. Conversely, when the quantity ratio of the FRAM cell 10 and the SRAM cell 20 is increased (i.e., the number of FRAM cells 10 is increased and the number of SRAM cells 20 is decreased), the access latency of the memory 530 is increased, as shown at point P4.

Referring back to FIG. 5, in the memory 530, the quantity ratio of the FRAM cells 10 within the first memory array 532 and the SRAM cells 20 within the second memory array 534 is determined according to various applications. For example, if the memory 530 is implemented as a cache, the quantity ratio of the FRAM cells 10 and the SRAM cells 20 is determined according to the latency requirement of the cache. As described above, the L1 cache is the fastest cache and the L3 cache is the slowest cache. Therefore, if the memory 530 is implemented as the L1 cache, the number of FRAM cells 10 is decreased so that the number of FRAM cells 10 is much less than the number of SRAM cells 20 in the L1 cache. In some embodiments, no FRAM cell 10 is present in the memory 530 that is used as the L1 cache. Conversely, if the memory 530 is implemented as the L3 cache, the number of FRAM cells 10 is increased so that the number of FRAM cells 10 is greater than or equal to the number of SRAM cells 20 in the L3 cache. In other words, the bit cells formed by the SRAM cells 20 can be replaced by the FRAM cells 10, thereby decreasing the area of the memory 530. Thus, the cost of manufacturing the IC including the memory 530 is decreased.

In some embodiments, the quantity ratio of the FRAM cells 10 and the SRAM cells 20 is determined according to the requirements regarding the area and/or the access latency of the memory 530. For example, if the area is the main consideration for the memory 530, the number of FRAM cells 10 is greater than the number of SRAM cells 20. Thus, the quantity ratio of the FRAM cells 10 and the SRAM cells 20 is increased and may be greater than 1. If the access latency is the main consideration for the memory 530, the number of FRAM cells 10 is less than the number of SRAM cells 20. Thus, the quantity ratio of the FRAM cells 10 and the SRAM cells 20 is decreased and may be less than 1.

In some embodiments, the memory 530 of FIG. 5 is implemented as the L3 cache. Furthermore, the number of FRAM cells 10 is greater than the number of SRAM cells 20. In general, most memory accesses are for the L1 and L2 caches. Typically, the L3 or Last Level Cache (LLC) cache has an access ratio per instruction set of less than a specific value, e.g., 1%. Therefore, despite FRAM cell's intrinsic slower write and read latency, the FRAM cell can still be effectively used as the L3 cache. Furthermore, the first memory array 532 formed by the FRAM cells 10 can provide the large capacity to mitigate some of the loss in latency compared to conventional SRAM since more FRAM cells can be written in the same time period.

Figure 8:
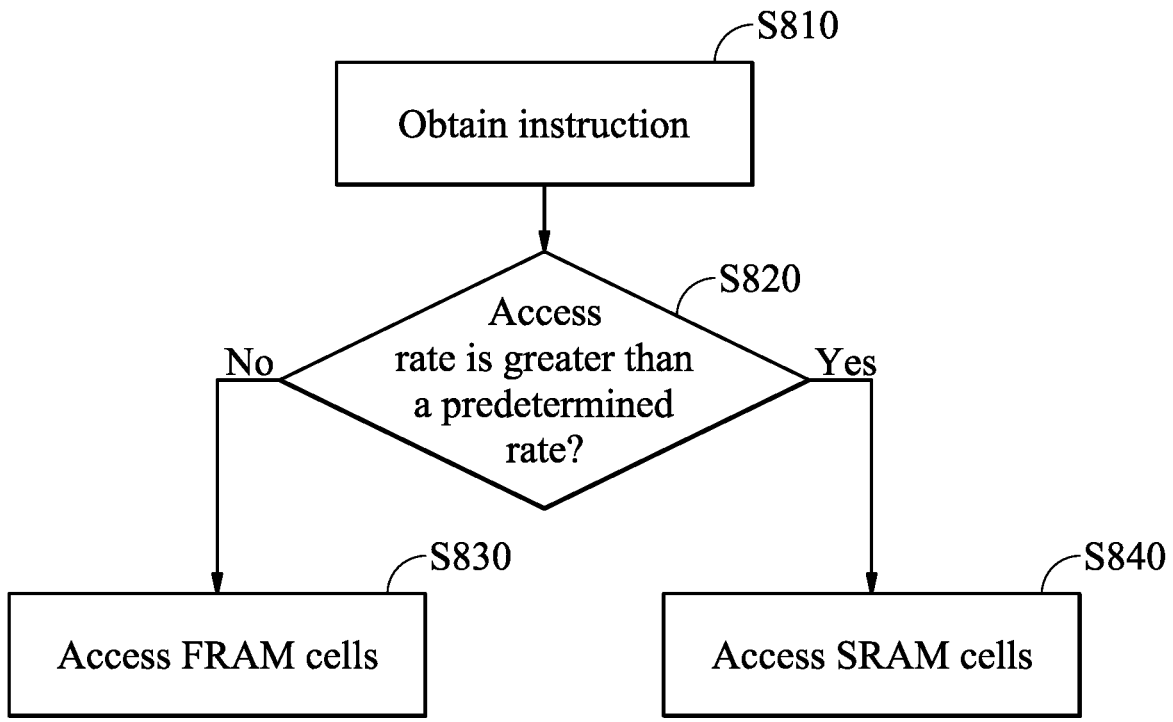
FIG. 8 illustrates a method for accessing the memory of FIG. 5, in accordance with some embodiments of the disclosure.

FIG. 8 illustrates a method for accessing the memory 530 of FIG. 5, in accordance with some embodiments of the disclosure. As described above, the controller 515 is configured to access the memory 530 through the address bus 552 and the data bus 554 in response to instructions of the processing unit 510 in FIG. 5. In some embodiments, the method of FIG. 8 is performed by the controller 515 or the processing unit 510 of FIG. 5.

In operation S810, the controller 515 obtains one or more instructions for accessing the memory 530. In some embodiments, the instruction may be a write instruction.

In operation S820, the access rate of the memory 530 is obtained, and the controller 515 is configured to determine whether the access rate of the memory 530 is greater than a predetermined rate. In some embodiments, the access rate is the write rate, and the write rate represents the number of write instructions that the memory 530 executes in a predetermined period of time. In some embodiments, the predetermined rate of the memory 530 used as the L3 cache is 1%. In some embodiments, the access rate of the memory 530 is obtained by the controller 515. In some embodiments, the access rate of the memory 530 is provided by other circuits.

If the controller 515 determines that the access rate of the memory 530 is less than or equal to the predetermined rate (e.g., 1%), the controller 515 accesses the first memory array 532 formed by the FRAM cells 10 according to the corresponding instructions in operation S830. If the controller 515 determines that the access rate of the memory 530 is greater than the predetermined rate, the controller 515 accesses the second memory array 534 formed by the SRAM cells 20 according to the corresponding instructions in operation S840.

Therefore, when the write ratio is too high (i.e., greater than 1%), the controller 515 of the processing unit 510 must delegate some tasks to the SRAM cells 20 of the second memory array 534. Furthermore, this is particularly the case for high memory accesses for computationally intensive applications.

Embodiments of memories with the FRAM cells and the SRAM cells and the methods for accessing the memories are provided. The FRAM cells are implemented in a memory with a small amount of SRAM cells for decreasing the total memory array area. Therefore, the small amount of SRAM cells are used as a write buffer for the memory when write rate is increased. By maintaining a high ratio of FRAM cells to SRAM cells in number, the larger capacity of FRAM cells can compensate for the higher latency of the FRAM cell. Furthermore, the quantity ratio of the FRAM cells and the SRAM cells in a memory is determined depending on technology node and optimization of capacity and performance.

In some embodiments, a memory is provided. The memory includes a plurality of ferroelectric random access memory (FRAM) cells arranged in a first memory array, a plurality of static random access memory (SRAM) cells arranged in a second memory array, and a controller configured to access the first memory array and the second memory array with different access rate. Each of the FRAM cells includes a ferroelectric field-effect transistor (FeFET). A gate structure of the FeFET includes a gate electrode over a channel of the FeFET, a ferroelectric layer over the gate electrode, a first electrode over the gate electrode, and a second electrode over the first electrode. The ferroelectric layer is formed between the first and second electrodes.

In some embodiments, an integrated circuit (IC) is provided. The IC includes a memory, a second bus and a controller. The memory includes a first memory array formed by a plurality of ferroelectric random access memory (FRAM) cells, a second memory array formed by a plurality of static random access memory (SRAM) cells, and a first bus coupled to and shared by the first and second memory arrays. The controller is coupled to the memory through the first bus, and is configured to access the first memory array with a first access rate when an obtained access rate is less than or equal to a predetermined rate and the second memory array with a second access rate when the obtained access rate is greater than the predetermined rate through the first bus. The first access rate, the second access rate, and the predetermined rate represent the number of write instructions that the memory executes in a predetermined time In some embodiments, a memory is provided. The memory includes a first memory array, a second memory array and a bus coupled to the first and second memory arrays. The first memory array includes a plurality of ferroelectric random access memory (FRAM) cells. The second memory array includes a plurality of static random access memory (SRAM) cells. The first memory array and the second memory array are accessed with different access rate through the bus. Each of the FRAM cells comprises a ferroelectric field-effect transistor (FeFET). A gate structure of the FeFET includes a gate electrode over a channel of the FeFET, a ferroelectric layer over the gate electrode, a first electrode over the gate electrode, and a second electrode over the first electrode. The ferroelectric layer is formed between the first and second electrodes.

The foregoing outlines nodes of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory, comprising:
    a plurality of ferroelectric random access memory (FRAM) cells arranged in a first memory array;
    a plurality of static random access memory (SRAM) cells arranged in a second memory array; and
    a controller configured to access the first memory array and the second memory array with different access rate,
    wherein each of the FRAM cells comprises a ferroelectric field-effect transistor (FeFET), and a gate structure of the FeFET comprises:
        a gate electrode over a channel of the FeFET;
        a ferroelectric layer over the gate electrode;
        a first electrode over the gate electrode; and
        a second electrode over the first electrode,
        wherein the ferroelectric layer is formed between the first and second electrodes.

2. The memory as claimed in claim 1, wherein size of each of the SRAM cells is greater than that of each of the FRAM cell.

3. The memory as claimed in claim 1, further comprises a shared bus shared by the first memory array and the second memory array, wherein the controller is configured to access the first memory array and the second memory array through the shared bus.

4. The memory as claimed in claim 3, wherein the shared bus comprises a first bus coupled to the first memory array and the second memory array and a second bus coupled the controller to the first bus.

5. The memory as claimed in claim 4, wherein the second bus comprises an address bus and a data bus.

6. The memory as claimed in claim 1, wherein a first access rate of the first memory array is lower than a second access rate of the second memory array.

7. The memory as claimed in claim 1, wherein the gate structure of the FeFET further comprises:
    an interfacial layer formed between the channel of the FeFET and the gate electrode.

8. The memory as claimed in claim 7, wherein the gate structure of the FeFET further comprises:
    a dielectric layer of high-K material formed between the interfacial layer and the gate electrode.

9. The memory as claimed in claim 1, wherein the gate structure of the FeFET further comprises:
a metal layer between the gate electrode and the ferroelectric layer.

10. An integrated circuit (IC), comprising:
a memory, comprising:
a first memory array formed by a plurality of ferroelectric random access memory (FRAM) cells;
a second memory array formed by a plurality of static random access memory (SRAM) cells; and
a first bus coupled to and shared by the first and second memory arrays; and
a controller coupled to the memory through the first bus, and configured to access the first memory array with a first access rate when an obtained access rate is less than or equal to a predetermined rate and the second memory array with a second access rate when the obtained access rate is greater than the predetermined rate through the first bus,
wherein the first access rate, the second access rate, and the predetermined rate represent the number of write instructions that the memory executes in a predetermined time.

11. The IC as claimed in claim 10, wherein the number of the FRAM cells is greater than that of the SRAM cells, and size of the SRAM cell is greater than that of the FRAM cell.

12. The IC as claimed in claim 10, further comprises a second bus couple the controller to the first bus, wherein the controller is configured to access the first memory array and the second memory array through the first bus and the second bus.

13. The IC as claimed in claim 10, wherein each of the FRAM cells comprises a ferroelectric field-effect transistor (FeFET), and wherein a gate structure of the FeFET comprises a gate electrode over a channel of the FeFET and a ferroelectric layer over the gate electrode.

14. The IC as claimed in claim 13, wherein the gate structure of the FeFET further comprises a first electrode over the gate electrode and a second electrode over the first electrode, wherein the ferroelectric layer is formed between the first and second electrodes.

15. The IC as claimed in claim 14, wherein the gate structure of the FeFET further comprises a metal layer between the gate electrode and the first electrode.

16. A memory, comprising:
a first memory array comprising a plurality of ferroelectric random access memory (FRAM) cells;
a second memory array comprising a plurality of static random access memory (SRAM) cells; and
a bus coupled to the first and second memory arrays,
wherein the first memory array and the second memory array are accessed with different access rate through the bus,
wherein each of the FRAM cells comprises a ferroelectric field-effect transistor (FeFET), and a gate structure of the FeFET comprises:
a gate electrode over a channel of the FeFET;
a ferroelectric layer over the gate electrode;
a first electrode over the gate electrode; and
a second electrode over the first electrode,
wherein the ferroelectric layer is formed between the first and second electrodes.

17. The memory as claimed in claim 16, wherein the bus comprises a first sub-bus coupled to the first memory array and the second memory array and a second sub-bus coupled the first bus to a controller.

18. The memory as claimed in claim 17, wherein the first sub-bus comprises an internal address bus and an internal data bus shared by the first memory array and the second memory array.

19. The memory as claimed in claim 16, wherein number of transistors of the SRAM cell is greater than that of the FRAM cell.

20. The memory as claimed in claim 16, wherein the SRAM cell comprises two P-type transistors and four N-type transistors, and the N-type and P-type transistors are fin field effect transistors (FinFETs).

* * * * *